United States Patent [19]
Shen

[11] Patent Number: 5,942,932
[45] Date of Patent: Aug. 24, 1999

[54] CIRCUIT AND METHOD FOR PREVENTING LATCH-UP IN A CMOS SEMICONDUCTOR DEVICE

[75] Inventor: David H. Shen, Saratoga, Calif.

[73] Assignee: NanoAmp Solutions, Inc., San Jose, Calif.

[21] Appl. No.: 08/918,353

[22] Filed: Aug. 26, 1997

[51] Int. Cl.[6] .................................................. H03K 17/16
[52] U.S. Cl. ........................................... 327/530; 327/535
[58] Field of Search .................................... 327/530, 531, 327/535, 537, 321, 313; 361/18, 90, 91

[56] References Cited

U.S. PATENT DOCUMENTS

| | | | |
|---|---|---|---|
| 4,647,956 | 3/1987 | Shrivastava et al. | 257/373 |
| 4,794,278 | 12/1988 | Vajdic | 327/537 |
| 5,206,553 | 4/1993 | Imai et al. | 327/321 |
| 5,212,616 | 5/1993 | Dhong et al. | 361/18 |
| 5,220,534 | 6/1993 | Redwine et al. | 365/226 |
| 5,268,600 | 12/1993 | Yeu | 327/309 |
| 5,300,824 | 4/1994 | Iyengar | 365/228 |
| 5,345,422 | 9/1994 | Redwine | 365/189.09 |
| 5,392,186 | 2/1995 | Alexander et al. | 361/92 |
| 5,545,934 | 8/1996 | Reddy et al. | 307/130 |

*Primary Examiner*—Tuan T. Lam
*Attorney, Agent, or Firm*—Carr & Ferrell LLP

[57] ABSTRACT

A circuit and method for preventing latch-up in a CMOS semiconductor device. In an n-type substrate and p-type well region semiconductor, the method comprises the steps of pulling $V_{sub}$ of the substrate terminal to $V_{CC}$ and pulling $V_{well}$ of the well region terminal to $V_{SS}$ when $V_{CC}$ is below a predetermined voltage $V_{det}$, and releasing $V_{CC}$ and $V_{SS}$ from respective substrate and well region terminals when $V_{CC}$ rises above $V_{det}$. Or, if $V_{CC}$ is above both $V_{det}$ and $V_{sub}$ then pulling $V_{sub}$ to $V_{CC}$ and pulling $V_{well}$ to $V_{SS}$. If $V_{CC}$ is above $V_{det}$ but below $V_{sub}$ then pulling $V_{well}$ below $V_{SS}$. Similarly, in a p-type substrate and n-type well region semiconductor, the method comprises the steps of pulling $V_{sub}$ of the substrate terminal to $V_{SS}$ and pulling $V_{well}$ of the well region terminal to $V_{CC}$ when $V_{CC}$ is below a predetermined voltage $V_{det}$, and releasing $V_{SS}$ and $V_{CC}$ from respective substrate and well region terminals when $V_{CC}$ rises above $V_{det}$. Or, if $V_{CC}$ is above both $V_{det}$ and $V_{sub}$ then pulling $V_{sub}$ to $V_{SS}$ and $V_{well}$ to $V_{CC}$. If $V_{CC}$ is above $V_{det}$ but below $V_{sub}$ then pulling $V_{sub}$ below $V_{SS}$.

43 Claims, 14 Drawing Sheets

LATCH-UP PREVENTION CIRCUIT

LATCH-UP PREVENTION CIRCUIT

POWER-ON DETECTOR

FLIP-FLOP CIRCUIT

PUMP CORE

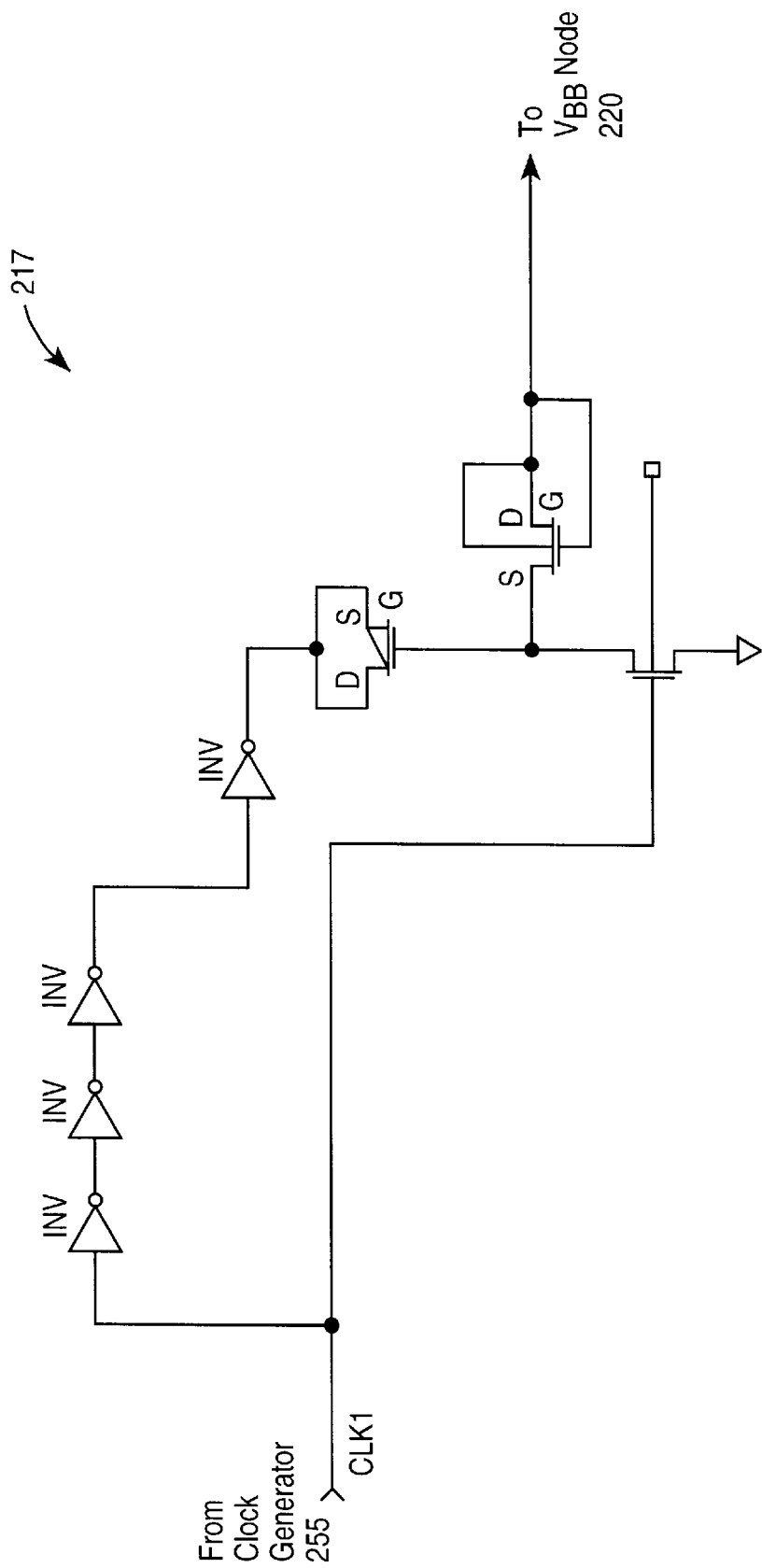
FIG. 5B  V<sub>BB</sub> PUMP CORE

CIRCUIT AND METHOD FOR PREVENTING LATCH-UP IN A CMOS SEMICONDUCTOR DEVICE

This invention is related to an invention by the same inventor, assigned to the same assignee and described in a patent application entitled "HIGH-SPEED ASYNCHRONOUS MEMORY WITH CURRENT-SENSING SENSE AMPLIFIERS," which is hereby incorporated by reference in its entirety.

BACKGROUND OF THE INVENTION

1. Field of the Invention

The present invention relates generally to semiconductors and more specifically to a circuit and method for preventing latch-up occurrence in a CMOS semiconductor device.

2. Background Art

"Latch-up" is an undesired silicon controlled rectifier action which can lead to the destruction or malfunction of an integrated circuit CMOS semiconductor device 100, which is shown in FIG. 1. In addition, latch-up can destroy a power supply 103 providing the $V_{CC}$ power supply voltage to CMOS semiconductor device 100. Latch-up typically occurs when a parasitic bipolar transistor circuit 105, which is inherent in a CMOS semiconductor device 100, turns on during the initial application (or power-on) of power supply 103 and remains on after removal of the signal which triggers the forward biasing of parasitic bipolar transistor circuit 105.

Parasitic bipolar transistor circuit 105 includes the following: a parasitic pnp bipolar junction transistor 110, a parasitic npn bipolar junction transistor 115, resistors 120, 125, and 130 representing the equivalent resistance of an n-type substrate 135, and a resistor 140 representing the equivalent resistance of a p-well region 145. (FIG. 2 shows parasitic bipolar transistor circuit 105 in an equivalent circuit model.)

The $V_{CC}$ voltage level is tied to the voltage level of a p+ diffusion 150 of a p-channel transistor (not shown) in CMOS semiconductor device 100. The $V_{SS}$ voltage level is tied to the voltage level of an n+ diffusion 152 of an n-channel transistor (not shown) in CMOS semiconductor device 100.

Reference is now made to both FIGS. 1 and 2. Two conditions are required to trigger latch-up in CMOS semiconductor device 100. The first condition is for the n-type substrate 135 voltage, "$V_{NN}$," to fall to at least one diode drop or "$VD_{(on)}$" (typically 0.6 volts) below the $V_{CC}$ voltage level. As known by those skilled in the art, the $VD_{(on)}$ voltage value is alternatively named as the "bipolar transistor turn-on voltage", the "diode turn-on voltage", or "$VBE_{(on)}$". When this first condition occurs (i.e., $V_{NN}$ falls below $V_{CC}$ by at least one diode drop), an unwanted trigger current 155 generates and flows between the emitter-base junction of parasitic pnp bipolar junction transistor 110. This unwanted trigger current 155 will cause parasitic pnp bipolar junction transistor 110 to become forward biased. Since parasitic pnp bipolar junction transistor 110 becomes forward biased, it generates a second trigger current 160 which flows between the emitter-base junction of parasitic npn bipolar junction transistor 115.

The second condition required for latch-up is for the p-well region 145 voltage, "$V_{BB}$," to rise to at least one $VD_{(on)}$ above the $V_{SS}$ ground or reference potential. When this second condition occurs, then second trigger current 160 can cause parasitic npn bipolar junction transistor 115 to become forward biased. When parasitic pnp bipolar junction transistor 110 and parasitic npn bipolar junction transistor 115 become forward biased, latch-up occurs in CMOS semiconductor device 100.

If latch-up occurs, CMOS semiconductor device 100 will remain "on" even after unwanted trigger currents 155 and 160 are removed. Eventually, power supply 103 can short-circuit to the $V_{SS}$ reference potential, thereby leading to the destruction or malfunction of CMOS semiconductor device 100 and/or of power supply 103 itself.

As supply voltages have scaled down, it is also becoming common to use charge pumps for boosting the $V_{CC}$ supply voltage level and the $V_{NN}$ n-type substrate voltage level in a CMOS semiconductor device. This is particularly important in semiconductor memories such as SRAMS, DRAMs, and EEPROMS. In order to combat leakage currents in memory cells, it is common to use charge pumps for applying a negative bias voltage to the well region surrounding the memory array. However, the use of charge pumps increases the likelihood of latch-up, since it is possible for the substrate and well junction to become forward biased during the power-on condition. Thus, there is a need for a circuit for preventing latch-up in these charge pump based circuits.

One method to prevent latch-up in CMOS semiconductor devices is by applying a negative biasing voltage (commonly known as "back-bias voltage") to p-well region 145. Back-bias circuits or methods are shown and described in U.S. Pat. Nos. 4,794,278, 4,647,956, 5,545,934, and 5,220,534, all of which are fully incorporated herein by reference thereto as if fully reproduced immediately hereinafter. The negative back-bias voltage causes the emitter-base junction of parasitic npn bipolar junction transistor 115 to become reversed biased. This additional negative voltage provided by the back-bias voltage to p-well region 145 prevents the forward biasing of the emitter-base junction of parasitic npn bipolar junction transistor 115, thereby decreasing the probability of latch-up.

Another method to decrease the probability of latch-up is by increasing the impurity doping in p-well region 145, thereby decreasing minority carrier lifetime in the base region of parasitic npn bipolar junction transistor 115. However, this particular method leads to higher capacitance and to slower operating speeds of CMOS semiconductor device 100, as noted in Price, Betty, *Semiconductor Memories*, John Wiley & Sons, New York, N.Y. (2nd ed. 1991), which is fully incorporated herein by reference thereto as if fully reproduced immediately hereinafter. Still another method for decreasing the probability of latch-up is by using guard rings on p-well region 145. However, guard rings require additional space and will, therefore, increase the size of CMOS semiconductor device 100.

In addition, the conventional approaches mentioned above do not address the condition after initial power-up when the $V_{CC}$ voltage level has already risen to, for example, the $V_{TH}$ voltage level and when $V_{CC}$ has risen above the $V_{NN}$ voltage level. The $V_{TH}$ voltage is also known as the MOS transistor threshold voltage and is typically in the range from about 0.6V to about 0.8V. As the $V_{CC}$ voltage level rises, it may rise faster than the $V_{NN}$ voltage level, thereby leading to voltage value differences between $V_{CC}$ and $V_{NN}$. When the $V_{CC}$ voltage level rises above the $V_{NN}$ voltage level, trigger current 155 may have a sufficient value to forward bias parasitic npn bipolar junction transistor 115, even if a negative bias voltage is being applied to p-well region 145 for reverse biasing parasitic npn bipolar junction transistor 115. Conventional approaches, therefore, do not decrease the probability of latch-up when the $V_{CC}$ supply voltage level has risen above or is rising above very low levels.

Thus, there remains a need for a circuit and method that overcome the foregoing deficiencies and prevent the problem of latch-up in a CMOS semiconductor device.

SUMMARY OF THE INVENTION

The present invention provides a method for preventing latch-up in a semiconductor device. The method includes the steps of:

(a) pulling a semiconductor substrate voltage potential to a first voltage potential when the first voltage potential is below a threshold voltage value, and releasing the semiconductor substrate voltage potential from the first voltage potential when the first voltage potential rises to the threshold voltage value;

(b) pulling a well region voltage potential to a second voltage potential when the first voltage potential of step (a) is below the threshold voltage value of step (a), and releasing the well region voltage potential from the second voltage potential when the first voltage potential rises to the threshold voltage value; and (c) if the first voltage potential of step (a) rises to the threshold voltage value of step (a) and above the semiconductor substrate voltage potential of step (a), pulling the semiconductor substrate voltage potential to the first voltage potential and pulling the well region voltage potential of step (b) to the second voltage potential of step (b).

The invention further provides a method for preventing latch-up in a semiconductor device, including the steps of:

(a) detecting the voltage of a first voltage potential;

(b) pulling the voltage of a well region of a first conductivity type to the voltage of the first voltage potential of step (a) when the voltage of the first voltage potential is below a predetermined value, and decoupling the voltage of the well region from the voltage of the first voltage potential when the voltage of the first voltage potential rises to the predetermined value;

(c) pulling the voltage of a semiconductor substrate to the voltage of a second voltage potential when the voltage of the first voltage potential of step (a) is below the predetermined value of step (b), and decoupling the voltage of the semiconductor substrate from the voltage of the second voltage potential when the voltage of the first voltage potential rises to the predetermined value, wherein the semiconductor substrate has a second conductivity type and is in contact with the well region of step (b); and (d) if the voltage of the first voltage potential of step (a) rises to the predetermined value of step (b) and above the voltage of the well region of step (b), pulling the voltage of the well region to the voltage of the first voltage potential and pulling the voltage of the semiconductor substrate of step (c) to the voltage of the second voltage potential of step (c).

The present invention provides a latch-up prevention circuit for preventing latch-up in a semiconductor device, including: a first clamping circuit responsive to the voltage level of a first voltage potential by pulling the voltage level of a semiconductor substrate of a first conductivity type to the voltage level of the first voltage potential when the voltage level of the first voltage potential is below a threshold voltage value and by releasing the voltage level of the semiconductor substrate from the voltage level of the first voltage potential when the voltage level of the first voltage potential rises to the threshold voltage value; a second clamping circuit coupled to the first clamping circuit, and responsive to the voltage level of the first voltage potential by pulling the voltage level of a well region of a second conductivity type to the voltage level of a second voltage potential when the voltage level of the first voltage potential is below the threshold voltage value and by releasing the voltage level of the well region from the voltage level of the second voltage potential when the voltage level of the first voltage potential rises to the threshold voltage value; and a helper circuit coupled to the first clamping circuit, and responsive to the voltage level of the first voltage potential by pulling the voltage level of the semiconductor substrate to the voltage level of the first voltage potential and by pulling the voltage level of the well region to the voltage level of the second voltage potential if the voltage level of the first voltage potential rises to the threshold voltage value and above the voltage level of the semiconductor substrate.

The present invention further provides a circuit for preventing latch-up in a semiconductor device, including: a first clamping circuit responsive to the voltage level of a first voltage potential by pulling the voltage level of a well region of a first conductivity type to the voltage level of the first voltage potential when the voltage level of the first voltage potential is below a predetermined level and by releasing the voltage level of the well region from the voltage level of the first voltage potential when the voltage level of the first voltage potential rises to the predetermined level; a second clamping circuit coupled to the first clamping circuit, and responsive to the voltage level of the first voltage potential by pulling the voltage level of a semiconductor substrate of a second conductivity type to the voltage level of a second voltage potential when the voltage level of the first voltage potential is below the predetermined level and by releasing the voltage level of the semiconductor substrate from the voltage level of the second voltage potential when the voltage level of the first voltage potential rises to the predetermined level; and a helper circuit coupled to the first clamping circuit, and responsive to the voltage level of the first voltage potential by pulling the voltage level of the well region to the voltage level of the first voltage potential and by pulling the voltage level of the semiconductor substrate to the voltage level of the second voltage potential if the voltage level of the first voltage potential rises to the predetermined level and above the voltage level of the well region.

The invention makes possible an advantage of preventing latch-up in a CMOS semiconductor device during initial power-up of the supply voltage source and as the supply voltage source level rises to higher values.

The invention makes possible an additional advantage of preventing latch-up in a CMOS semiconductor device without leading to higher capacitance and to slower operating speeds of the CMOS semiconductor device.

The invention makes possible an added advantage of preventing latch-up in a CMOS semiconductor device without requiring additional space in and increasing the size of the CMOS semiconductor device.

An additional advantage made possible by the present invention is a circuit and method which prevent latch-up in charge pump based circuits, including, but not limited to, low voltage SRAM, DRAM and/or EEPROM devices.

BRIEF DESCRIPTION OF THE DRAWINGS

FIG. 5B shows the details of the $V_{BB}$ pump core in FIG. 3;

DETAILED DESCRIPTION OF THE INVENTION

Those of ordinary skill in the art will realize that the following description of the present invention is illustrative only and not in any way limiting. Other embodiments of the invention will readily suggest themselves to those skilled in the art.

Figure 3:
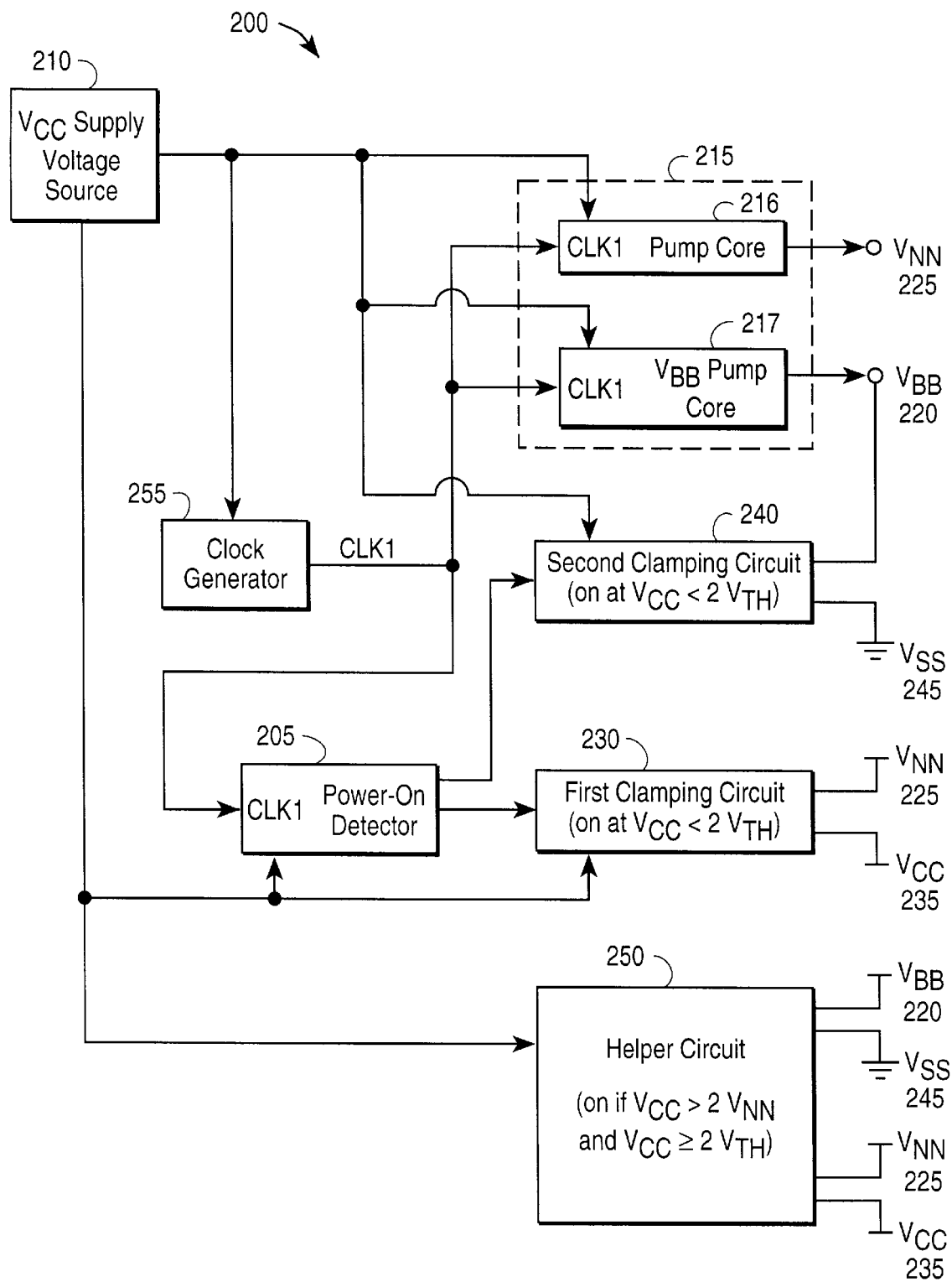
FIG. 3 shows a latch-up prevention circuit for preventing latch-up in a CMOS semiconductor device.
Figure 4A:
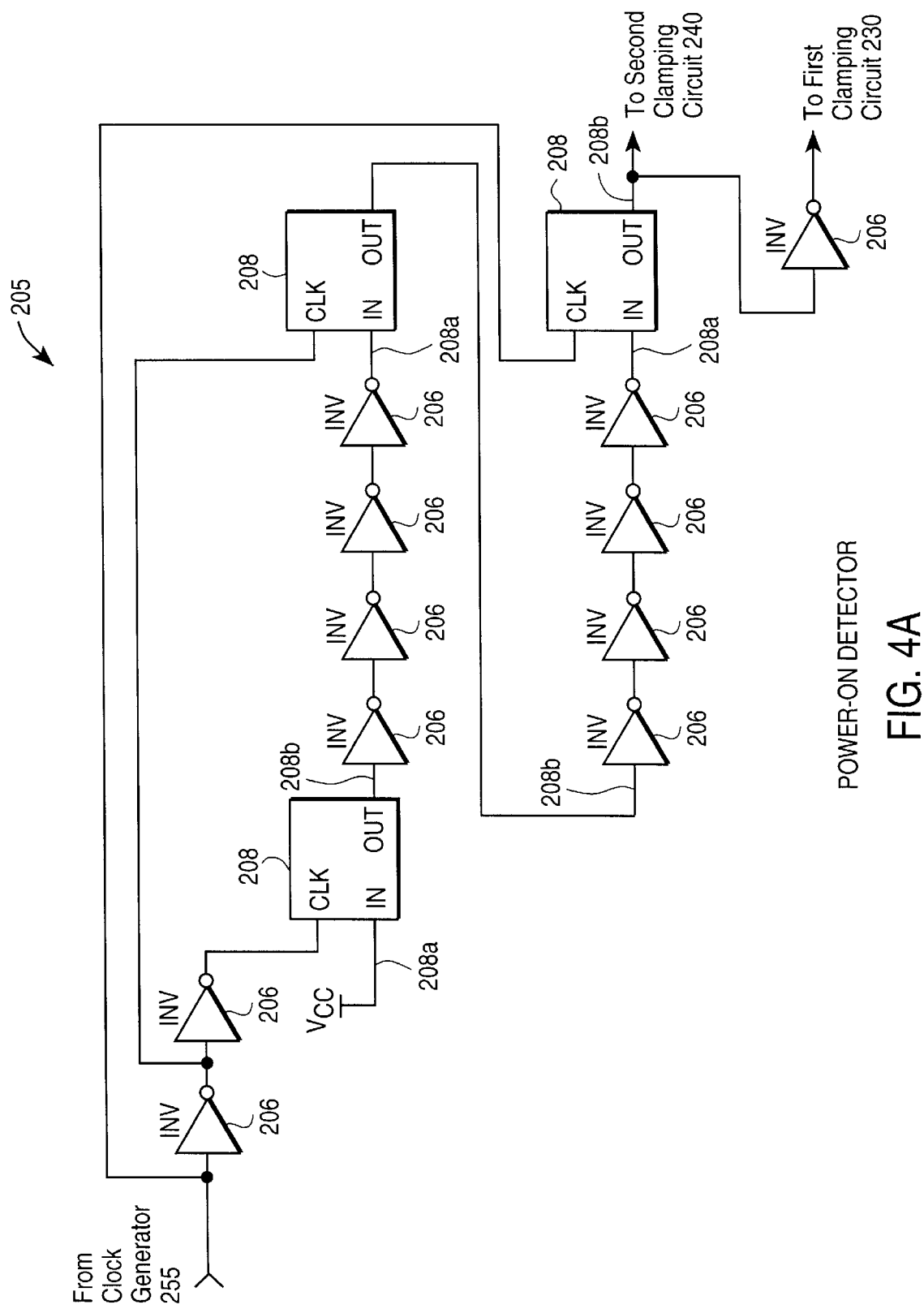
FIG. 4A shows the details of the power-on detector in FIG. 3.

FIG. 3 shows a latch-up prevention circuit 200 for preventing latch-up in a CMOS semiconductor device 100. Latch-up prevention circuit 200 includes a power-on detector or voltage detection circuit 205 for detecting the $V_{CC}$ voltage level of a supply voltage source 210. One preferred embodiment of a power-on detector 205 according to the invention is shown in FIG. 4A and includes inverters 206 and a flip-flop circuit 208.

Figure 4B:
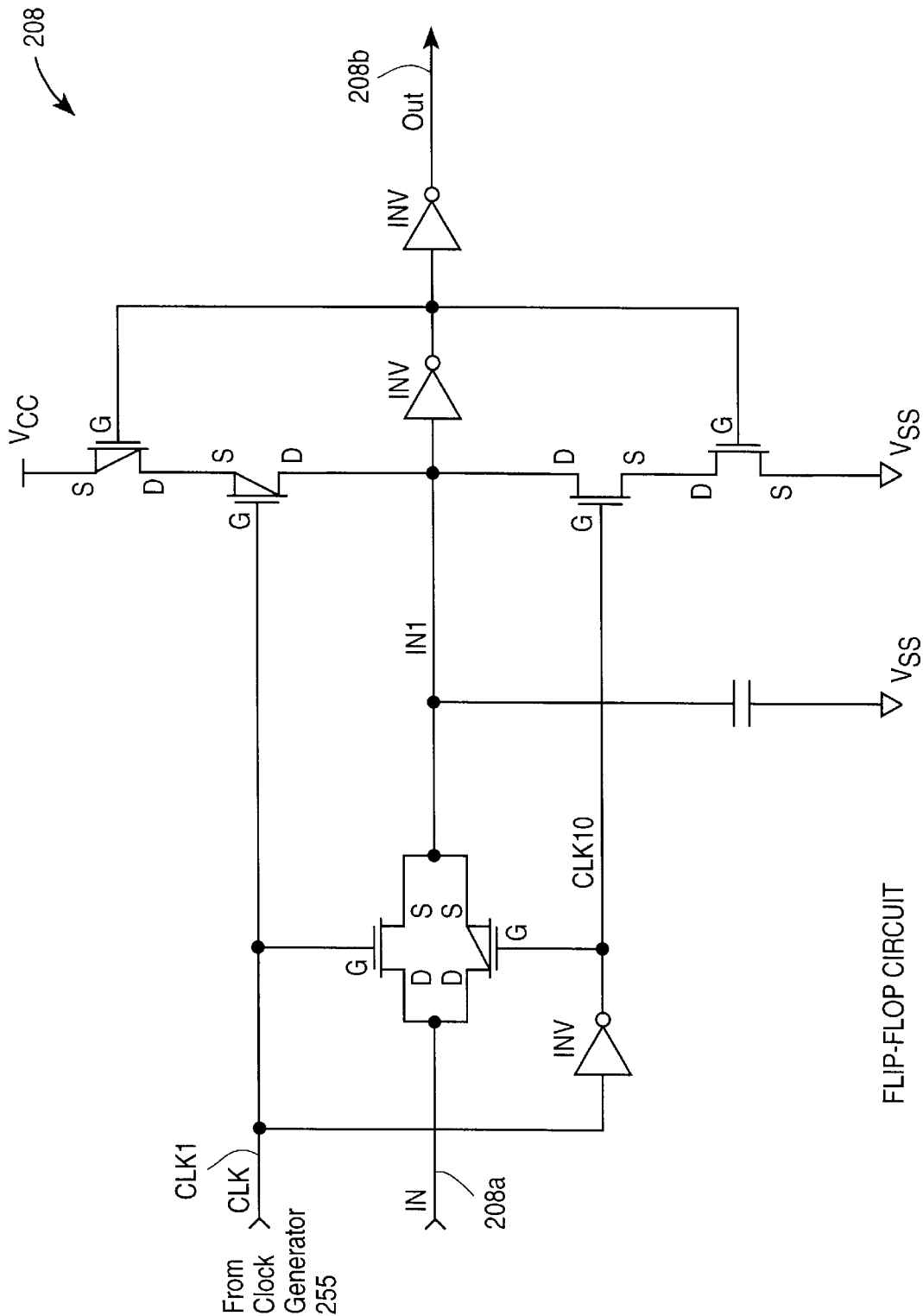
FIG. 4B shows the details of the flip-flop circuit (in FIG. 4A) which powers up in a known state.

The details of the flip-flop circuit 208 are best illustrated in FIG. 4B. The flip-flop circuit 208 includes an input line (or input terminal) 208a and an output line (or output terminal) 208b. The flip-flop circuit 208 powers up into a known state. When the $V_{CC}$ supply voltage rises above two transistor threshold voltages ($2V_{TH}$), the CLK1 clock signal (from clock generator 255) begins to transition, and the power-on detection circuit 205 changes state to indicate that the power is on. Other conventional power-on detector circuits are shown and described in U.S. Pat. Nos. 5,345,422 and 5,220,534, all of which are fully incorporated herein by reference thereto as if fully reproduced immediately hereinafter.

Figure 5A:
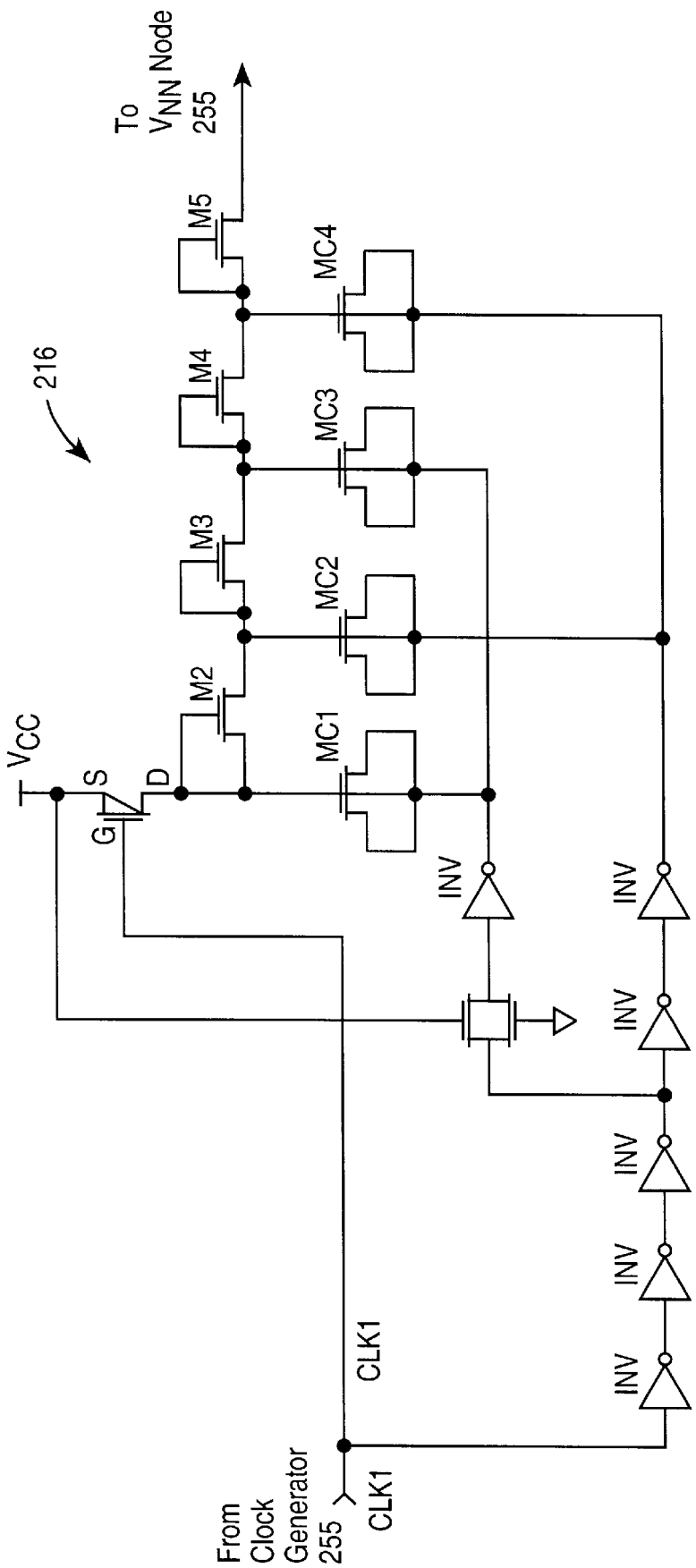
FIG. 5A shows the details of the pump core in FIG. 3.

A charge pump circuit 215 drives a $V_{BB}$ node (or $V_{BB}$ voltage potential) 220 indicating the $V_{BB}$ voltage level of a p-type well region 145 (FIG. 1), and drives a $V_{NN}$ node (or $V_{NN}$ voltage potential) 225 indicating the $V_{NN}$ voltage level of an n-type substrate 135 (FIG. 1) in a CMOS semiconductor device 100. Charge pump circuit 215 preferably includes a pump core 216 for driving positive charges to $V_{NN}$ node 225, and a $V_{BB}$ pump core 217 for driving negative charges to $V_{BB}$ node 220. FIG. 5A shows one example of pump core 216, while FIG. 5B shows one example of $V_{BB}$ PUMP core 217. Other conventional charge pump circuits are also shown and described in U.S. Pat. Nos. 5,220,534, 4,794,278, 5,392,186, 4,647,956, and 5,545,934, all of which are fully incorporated herein by reference thereto as if fully reproduced immediately hereinafter.

Latch-up prevention circuit 200 further includes a first clamping circuit (or $V_{NN}$ clamp) 230 connected to the following elements: power-on detector 205, $V_{NN}$ node 225 and $V_{CC}$ node (or first voltage potential) 235 indicating the $V_{CC}$ voltage level of supply voltage source 210. A second clamping circuit (or $V_{BB}$ clamp) 240 is connected to the following elements: power-on detector 205, $V_{BB}$ node 220 and a $V_{SS}$ node 245 indicating ground (or a second voltage) potential. A helper circuit 250 is connected to the following elements: $V_{BB}$ node 220, $V_{NN}$ node 225, $V_{CC}$ node 235, and $V_{SS}$ node 245.

Supply voltage source 210 provides power to: power-on detector 205, pump core 216, VBB pump core 217, first clamping circuit 230, second clamping circuit 240, helper circuit 250 and clock generator 255. When $V_{CC} \leq 2V_{TH}$, the clock generator 255 drives a transitioning clock signal, CLK1, to: power-on detector 205, pump core 216 and $V_{BB}$ pump core 217. Otherwise, the CLK1 signal does not transition.

Figure 6:
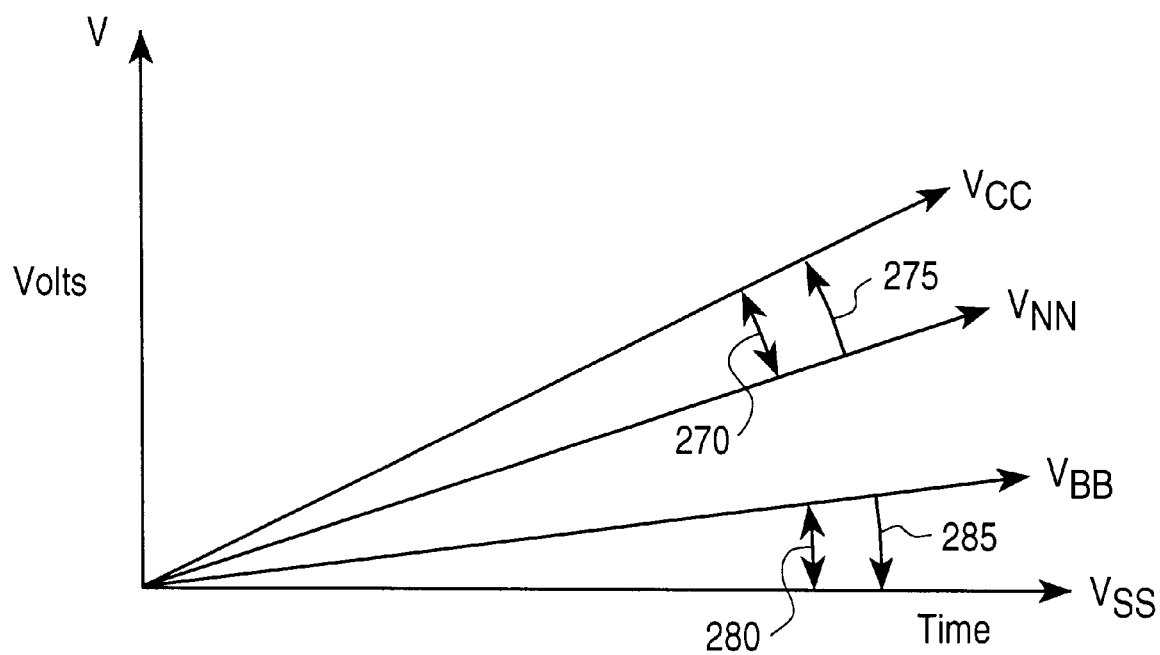
FIG. 6 is a graph illustrating the n-type semiconductor substrate voltage level, the p-type well region voltage level, the $V_{CC}$ supply voltage level, and the $V_{SS}$ reference voltage level.

Reference is now made to FIGS. 3 and 6 to discuss the operation of latch-up prevention circuit 200. During initial power-up of supply voltage source 210, the $V_{CC}$ voltage level will rise from zero voltage to positive voltage levels. Depending on the slope of $V_{CC}$ and on the inherent capacitance of $V_{NN}$ node 225, charge pump 215 may not be able to drive the $V_{NN}$ voltage level to follow the rising $V_{CC}$ voltage level, and this condition will result in a difference 270 (FIG. 6) between the slopes of $V_{CC}$ and $V_{NN}$.

As also mentioned above, supply voltage source 210 provides power to charge pump 215. Typically, charge pump 215 will require some finite time to generate sufficient charges for driving up the $V_{NN}$ voltage level after initial power-on of supply voltage source 210. This limitation of charge pump 215 may also result in a difference 270 between the slopes of $V_{CC}$ and $V_{NN}$.

If the $V_{NN}$ voltage level falls to about one diode drop $VD_{(on)}$ (typically 0.6 volts) below the $V_{CC}$ voltage level, then latch-up may occur. As the $V_{CC}$ level rises from about zero volt to about two transistor threshold voltages ($2V_{TH}$), power-on detector 205 outputs a signal to first clamping circuit 230, such that the $V_{NN}$ node 225 is clamped to the $V_{CC}$ node 235. Thus, first clamping circuit 230 will pull $V_{NN}$ in the direction of arrow 275 towards $V_{CC}$, such that the $V_{NN}$ and $V_{CC}$ voltage levels will be about equal during initial power-up of supply voltage source 210.

As stated above, supply voltage source 210 powers charge pump 215, thereby resulting in charge pump 215 to be temporarily inoperative during initial power-up. Thus, charge pump 215 may not be able to provide sufficient negative charges for preventing $V_{BB}$ from rising to positive voltage levels. This condition will result in a difference 280 between the slopes of $V_{BB}$ and $V_{SS}$ as shown in FIG. 6. $V_{BB}$ is preferably driven to a negative voltage level to prevent the emitter-base junction of parasitic npn bipolar junction transistor 115 (FIG. 1) in p-well region 145 from becoming forward biased. As stated above, the forward biasing of parasitic npn bipolar junction transistor 115 leads to the condition of latch-up.

Thus, as the $V_{CC}$ level rises from about zero volt to about two transistor threshold voltages ($2V_{TH}$) during initial power-up, power-on detector 205 outputs a signal to second clamping circuit 240 such that second clamping circuit 240 pulls down the level of $V_{BB}$ node 220 to the level of $V_{SS}$ node 245. As a result, $V_{BB}$ will move in the direction of arrow 285 towards $V_{SS}$, thereby preventing the $V_{BB}$ voltage level from reaching positive voltage levels which can lead to latch-up.

Figure 1:
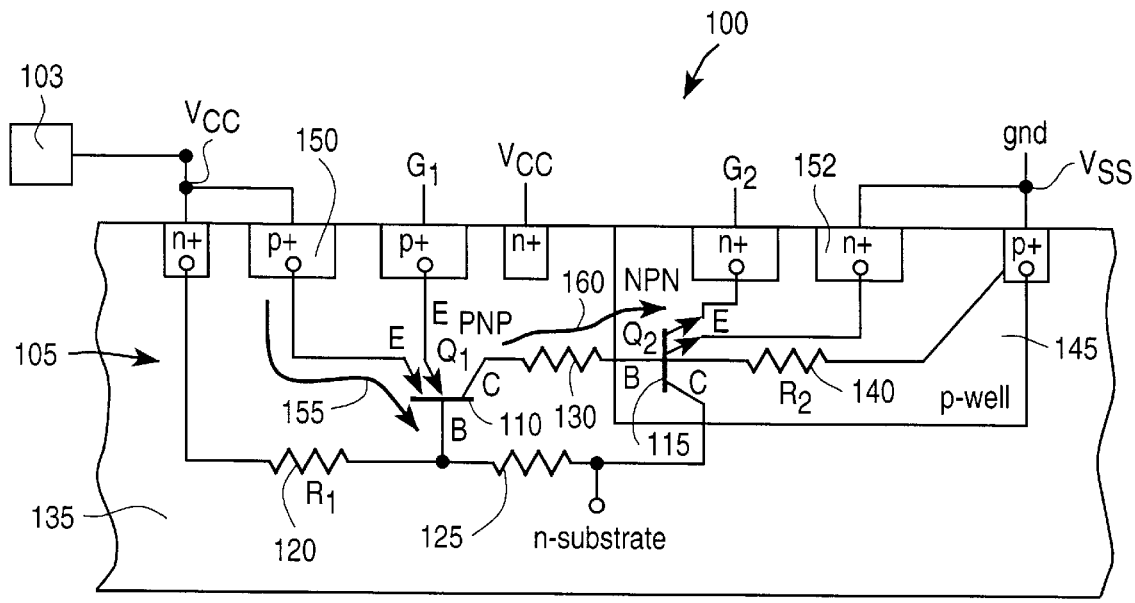
FIG. 1 shows an integrated circuit CMOS semiconductor device having an n-type substrate and a p-type well region.
Figure 2:
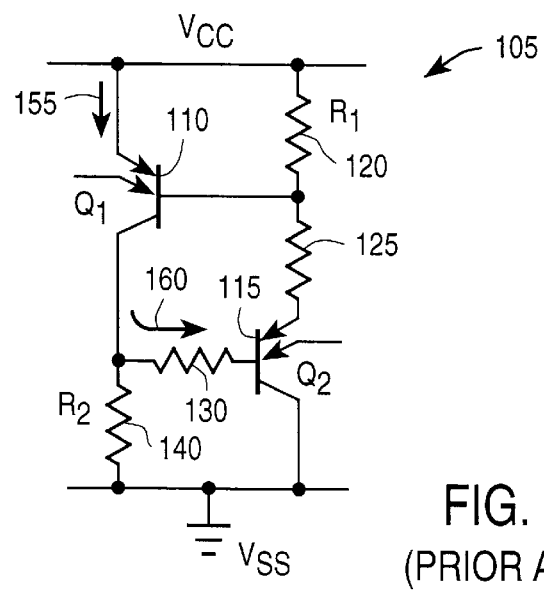
FIG. 2 shown an equivalent circuit model of a parasitic bipolar transistor circuit which is inherent in the CMOS semiconductor device of FIG. 1 and which causes latch-up.

When the $V_{CC}$ voltage level has risen to or above $2V_{TH}$, the CLK1 signal begins to transition, thereby enabling power-on detector 205 to change state. Since the power-on detector 205 changes state, it enables first clamping circuit 230 to release $V_{NN}$ node 225 from $V_{CC}$ node 235. Similarly, the power-on detector 205 enables second clamping circuit 240 to release $V_{BB}$ node 220 from $V_{SS}$ node 245, thereby permitting charge pump 215 to drive $V_{BB}$ node 220 to negative voltage levels. Driving $V_{BB}$ node 220 to negative voltage levels will also reduce the leakage currents 670a and 670b (FIG. 10) in a four transistor memory cell 600 disposed in a p-well region 145 of a CMOS semiconductor device 100 (FIG. 1). One of the currents 670a and 670b is the "on" current of one of the transistors 645 or 650, and the other current is the subthreshold leakage of the other transistor which is "off". The memory cell 600 holds its logic value by keeping the transistor 645 "on", while keeping the transistor 650 "off" (or by keeping the transistor 650 "on", while keeping the transistor 645 "off"). The "on" transistor will sink a current which is equal to about $V_{CC}/R$ wherein R is the value of the resistor 620 when transistor 645 is "on". If, instead, transistor 650 is "on", then R is the value of the resistor 635. The "off" transistor will leak some subthreshold current value. If the "off" transistor leaks an excessive current value, it may "flip" the cell 600. Thus, it is desirable to minimize the leakage currents in the cell 600.

Figure 7:
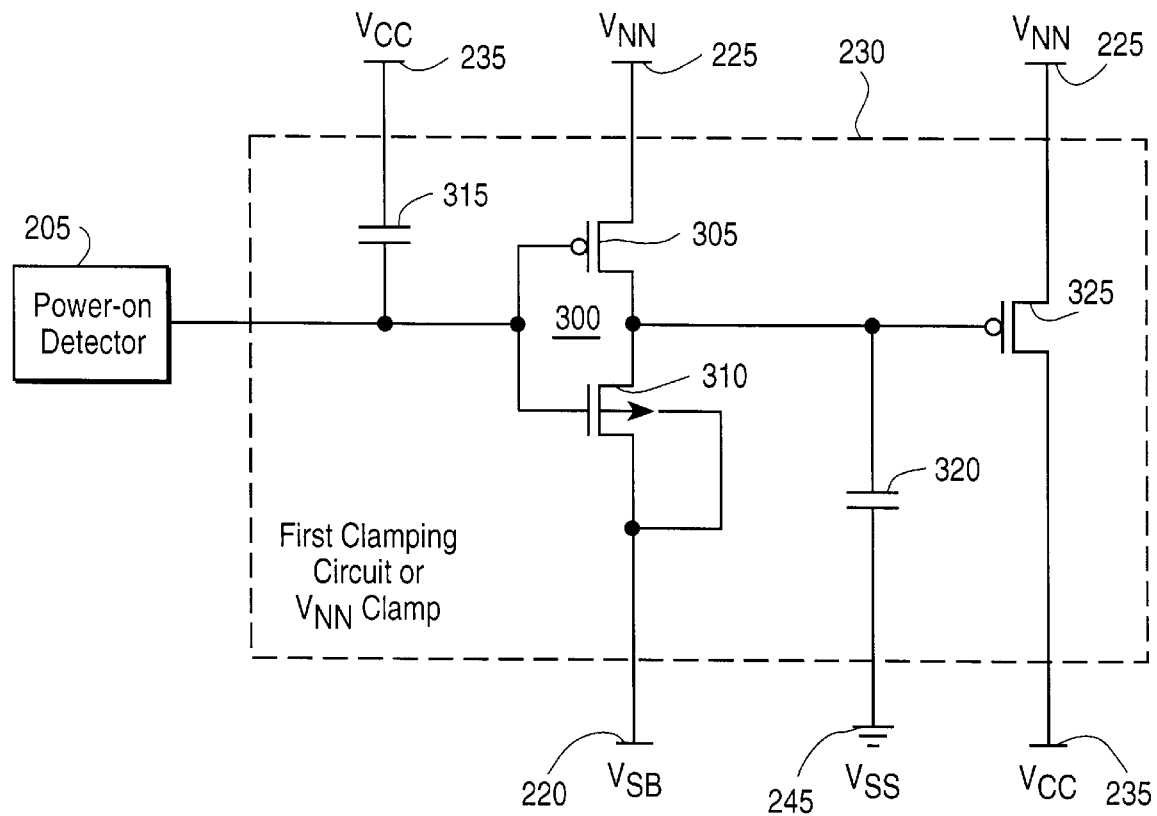
FIG. 7 shows the first clamping circuit according to a preferred embodiment of the invention.

FIG. 7 shows the first clamping circuit 230 according to a preferred embodiment of the invention. An inverter 300 includes a p-channel transistor 305 and an n-channel transistor 310 having their gates connected together and to power-on detector 205, and having their drains connected together. P-channel transistor 305 has its source connected to $V_{NN}$ node 225, while n-channel transistor 310 has its source and its bulk (substrate connection) connected to $V_{BB}$ node 220. A capacitor 315 is connected between $V_{CC}$ node 235 and the gates of p-channel transistor 305 and of n-channel transistor 310. A capacitor 320 is connected between $V_{SS}$ node 245 and the drains of p-channel transistor 305 and of n-channel transistor 310. A p-channel transistor 325 has its gate connected to the drains of p-channel transistor 305 and of n-channel transistor 310, has its source connected to $V_{NN}$ node 225 and has its drain connected to $V_{CC}$ node 235.

During the initial power-up of supply voltage source 210 ($V_{CC} < 2V_{TH}$), power-on detector 205 drives a high logic level signal to first clamping circuit 230. Inverter 300 inverts this high logic level signal into a low logic level signal, which turns on p-channel transistor 325. When p-channel transistor 325 is turned on, it pulls up the $V_{NN}$ node 225 voltage level to the $V_{CC}$ node 235 voltage level.

During initial power-up, capacitor 315 helps to pull up the voltage at the gates of p-channel transistor 305 and of n-channel transistors 310 to the $V_{CC}$ node 235 voltage level, while capacitor 320 helps to pull down the voltage at the gate of p-channel transistor 325 to the $V_{SS}$ node 245 voltage level.

When $V_{CC}$ rises to or above $2V_{TH}$ ($V_{CC} \geq 2V_{TH}$), then power-on detector 205 will output a low logic level signal to first clamping circuit 230. Inverter 300 inverts this low logic level signal from power-on detector 205 into a high logic level signal, which turns off p-channel transistor 325. When p-channel transistor 325 is turned off, it releases $V_{NN}$ node 225 from $V_{CC}$ node 235.

Figure 8:
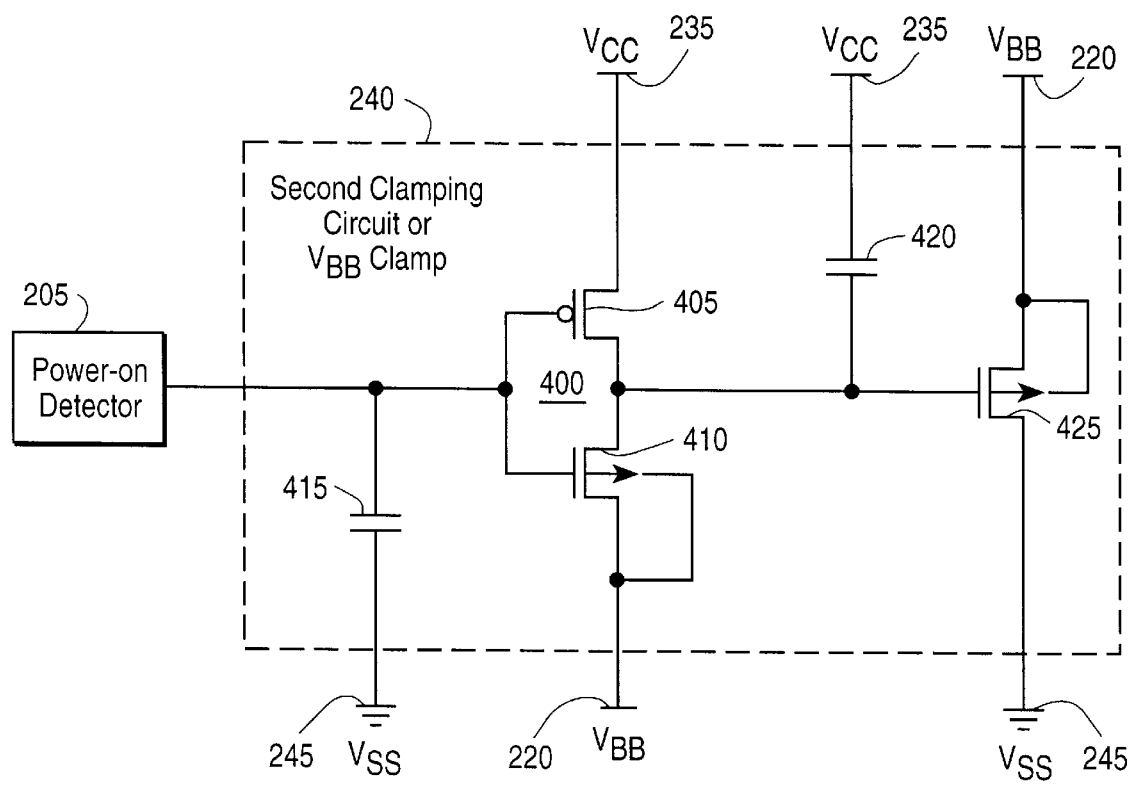
FIG. 8 shows the second clamping circuit according to a preferred embodiment of the invention.

FIG. 8 shows the second clamping circuit 240 according to a preferred embodiment of the invention. An inverter 400 includes a p-channel transistor 405 and an n-channel transistor 410 having their gates connected together and to power-on detector 205, and having their drains connected together. P-channel transistor 405 has its source connected to $V_{CC}$ node 235, while n-channel transistor 410 has its source and its bulk (substrate connection) connected to $V_{BB}$ node 220. A capacitor 415 is connected between $V_{SS}$ node 245 and the gates of p-channel transistor 405 and of n-channel transistor 410. A capacitor 420 is connected between $V_{CC}$ node 235 and the drains of p-channel transistor 405 and of n-channel transistor 410. An n-channel transistor 425 has its gate connected to the drains of p-channel transistor 405 and of n-channel transistor 410, has its source connected to $V_{SS}$ node 245 and has its drain and bulk connected to $V_{BB}$ node 220.

During the initial power-up of supply voltage source 210 ($V_{CC} < 2V_{TH}$), power-on detector 205 drives a low logic level signal to second clamping circuit 240. Inverter 400 inverts the low logic level signal from power-on detector 205 into a high logic level signal, which turns on n-channel transistor 425. When n-channel transistor 425 is turned on, it pulls down the $V_{BB}$ node 220 voltage level to the $V_{SS}$ node 245 voltage level.

During initial power-up, capacitor 415 helps to pull down the voltage at the gates of p-channel transistor 405 and of n-channel transistors 410 to the $V_{SS}$ node 245 voltage level, while capacitor 420 helps to pull up the voltage at the gate of p-channel transistor 425 to the $V_{CC}$ node 235 voltage level.

When $V_{CC}$ rises to or above $2V_{TH}$ ($V_{CC} \geq 2V_{TH}$), then power-on detector 205 will output a high logic level signal to second clamping circuit 240. Inverter 400 inverts the high logic level signal from power-on detector 205 into a low logic level signal, which turns off n-channel transistor 425. When n-channel transistor 425 is turned off, it releases $V_{BB}$ node 220 from $V_{SS}$ node 245. $V_{BB}$ pump core 217 (FIGS. 3 and 5B) will then drive $V_{BB}$ node 220 to negative voltage levels, thereby reducing leakage currents 670a and 670b (FIG. 10) in a four transistor memory cell 600 disposed on a p-well region 145 of a CMOS semiconductor device 100 (FIG. 1).

Figure 9:
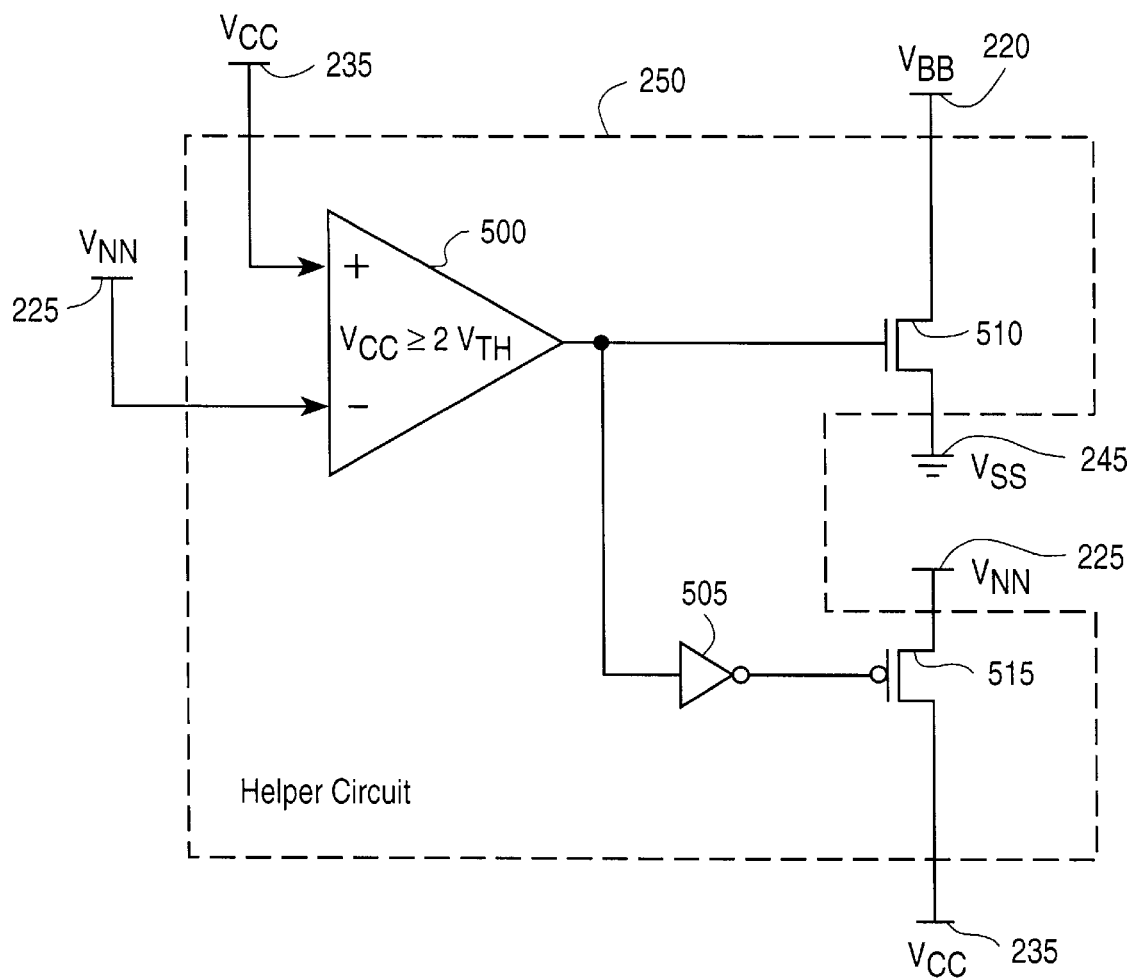
FIG. 9 shows the helper circuit according to a preferred embodiment of the invention.

FIG. 9 shows the helper circuit 250 according to a preferred embodiment of the invention. A comparator 500 has a positive (+) input terminal which senses the level of the $V_{CC}$ voltage level at $V_{CC}$ node 235, and has a negative (−) input terminal which senses the $V_{NN}$ voltage level at $V_{NN}$ node 225. Comparator 500 has its output terminal connected to an input terminal of an inverter 505 and to the gate of an n-channel transistor 510.

N-Channel transistor 510 has its drain connected to $V_{BB}$ node 220 and has its source connected to $V_{SS}$ node 245. A p-channel transistor 515 has its gate connected to the output terminal of inverter 505, has its source connected to $V_{NN}$ node 225 and has its drain connected to $V_{CC}$ node 235.

During the initial power-up of supply voltage source 210 ($V_{CC}<2V_{TH}$), comparator 500 is outputting a low logic level signal which turns off n-channel transistor 510. This low logic level signal from comparator 500 is inverted by inverter 505 into a high logic level signal which turns off p-channel transistor 515.

When $V_{CC}$ rises to or above $2V_{TH}$ ($V_{CC} \geq 2V_{TH}$) after initial power-up, and if $V_{CC}$ rises above $V_{NN}$, then comparator 500 will output a high logic level signal which turns on n-channel transistor 510. This high logic level signal from comparator 500 is inverted by inverter 505 into a low logic level signal which turns on p-channel transistor 515.

In another preferred embodiment, comparator 500 will output a high logic level signal when $V_{CC} \geq 2V_{TH}$ and if the $V_{CC}$ voltage level rises to or above the voltage level, "$V_{NN}+\Delta V_{offset}$", (i.e., $V_{CC} \geq V_{NN}+\Delta V_{offset}$), wherein $\Delta V_{offset}$ is an offset voltage value in the range from about one (1.0) millivolt to about four-hundred (400) millivolts. The $\Delta V_{offset}$ offset voltage value is typically selected to be less than 0.6V to prevent latch-up, but larger than the transistor mismatches (1 mV to 20 mV). As stated above, if $V_{CC}$ rises above $V_{NN}$, an unwanted trigger current 155 (FIG. 1) may generate current flow between the emitter-base junction of parasitic pnp bipolar junction transistor 110 (FIG. 1) resulting in the forward bias thereof. This condition can lead to potential latch-up. Thus, if the condition, $V_{CC} \geq V_{NN}+\Delta V_{offset}$, occurs, then comparator 500 can sense this condition and generate a high logic signal from its output terminal. This high logic level signal is driven into the gate of n-channel transistor 510 to turn it on. Since n-channel transistor 510 is turned on, it will pull down the $V_{BB}$ node 220 voltage level to the $V_{SS}$ node 245 voltage level. The high logic level signal from the output terminal of comparator 500 is also driven into and inverted by inverter 505. Thus, inverter 505 will output a low logic level signal which is driven into the gate of p-channel transistor 515 to turn it on. Since p-channel transistor 515 is turned on, it will pull up the $V_{NN}$ node 225 voltage level to the $V_{CC}$ node 235 voltage level.

It is preferred that comparator 500 outputs a high logic level signal when $V_{CC} \geq V_{NN}+\Delta V_{offset}$ for the following reason. Conventional comparators are non-ideal, thereby making it difficult to predict the exact voltage difference required between $V_{CC}$ and $V_{NN}$ for a comparator 500 to output a high logic level signal. As mentioned above, the $V_{NN}$ voltage level is preferably driven above the $V_{CC}$ voltage level such that latch-up is prevented. By requiring comparator 500 to output a high logic level signal when the $V_{CC}$ voltage level rises to or above the $V_{NN}+\Delta V_{offset}$ voltage level, comparator 500 will not output a high logic level signal when $V_{NN} \geq V_{CC}$.

Helper circuit 250 insures that the $V_{NN}$ voltage level remains about equal to the level of the $V_{CC}$ voltage level after initial power-up (i.e., $V_{CC} \geq 2V_{TH}$), since the charge pump 215 may not be able to supply sufficient charges to drive the $V_{NN}$ voltage level to follow the $V_{CC}$ voltage level as $V_{CC}$ rises. Similarly, the helper circuit 250 insures that the $V_{BB}$ voltage level remains about equal to the $V_{SS}$ voltage level after initial power-up (i.e., $V_{CC} \geq 2V_{TH}$), since charge pump 215 may not be able to supply sufficient charges to drive the $V_{BB}$ voltage level to the $V_{SS}$ voltage level as $V_{CC}$ rises.

When the $V_{NN}$ voltage level rises to or above the $V_{CC}$ voltage level, then helper circuit 250 will release $V_{BB}$ node 220 from $V_{SS}$ node 245. Similarly, helper circuit 250 will release $V_{NN}$ node 225 from $V_{CC}$ node 235. Under this condition ($V_{NN} \geq V_{CC}$), comparator 500 will output a low logic level signal which will turn off n-channel transistor 510, thereby releasing $V_{BB}$ node 220 from $V_{SS}$ node 245. This low logic level signal from comparator 500 is also inverted into a high logic level signal by inverter 505 to turn off p-channel transistor 515. Since p-channel transistor 515 is turned off, $V_{NN}$ node 225 is released from $V_{CC}$ node 235.

Figure 10:
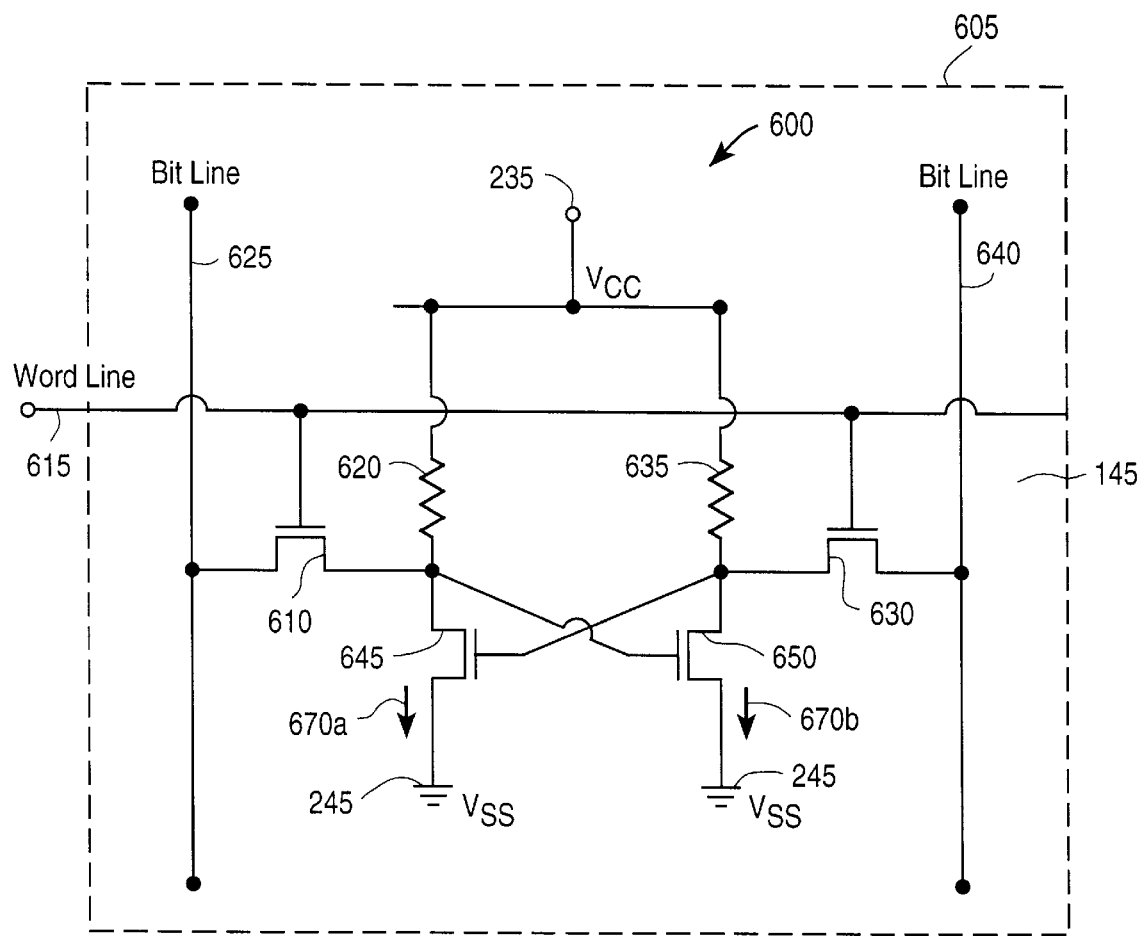
FIG. 10 shows a four-transistor memory cell disposed in a CMOS semiconductor device incorporating the invention.

FIG. 10 shows a four-transistor memory cell 600 disposed on a portion 605 of a p-well region 145 (FIG. 1) in a CMOS semiconductor device 100. Four-transistor memory cell 600 includes a first n-channel pass transistor 610 having a gate connected to a word line 615. First n-channel pass transistor 610 is also connected via resistor 620 to $V_{CC}$ node 235, and to a bitline 625. A second n-channel pass transistor 630 has a gate connected to wordline 615 and is also connected via resistor 635 to $V_{CC}$ node 235, and to a bitline 640.

Four-transistor memory cell 600 further includes an n-channel transistor 645 with its gate connected to resistor 635, its drain connected to resistor 620 and to n-channel pass transistor 610 and its source connected to $V_{SS}$ node 245. An n-channel transistor 650 has its gate connected to resistor 620, to n-channel pass transistor 610 and to the drain of n-channel transistor 645. N-channel transistor 650 has its source connected to $V_{SS}$ node 245 and has its drain connected to resistor 635 and to n-channel pass transistor 630.

Resistors 620 and 635 each has a value in the range of about one-hundred (100) gigaohms to about two-thousand (2,000) gigaohms. The leakage currents, including 670a and 670b, each of which have values ranging from about one (1) pico-ampere to about ten (10) pico-amperes, may be present even if the gate voltages of transistors 610, 630, 645 and 650 are at zero volt. If, for example, resistor 620 has a value of about two-hundred (200) gigaohms and a leakage current flowing therethrough has a value of about ten (10) pico-amperes, then the voltage drop across the resistor 620 will be equal to about two (2) volts. Thus, this voltage drop may be sufficient to cause loss of data stored in four-transistor memory cell 600.

Therefore, it is preferable to reduce the values of the leakage currents. $V_{BB}$ pump core 217 (FIGS. 3 and 5B) drives the p-well region 145 voltage to various negative voltage levels, typically from about 0 volt to about -1.5 volts. By driving the p-well region 145 voltage to negative levels, the values of the leakage currents are reduced, thereby avoiding data loss in four-transistor memory cell 600. The negative voltage value to which the p-well region 145 voltage is driven may vary for different applications and may be limited by the breakdown voltages of the transistors 610, 630, 645 and 650.

Figure 11:
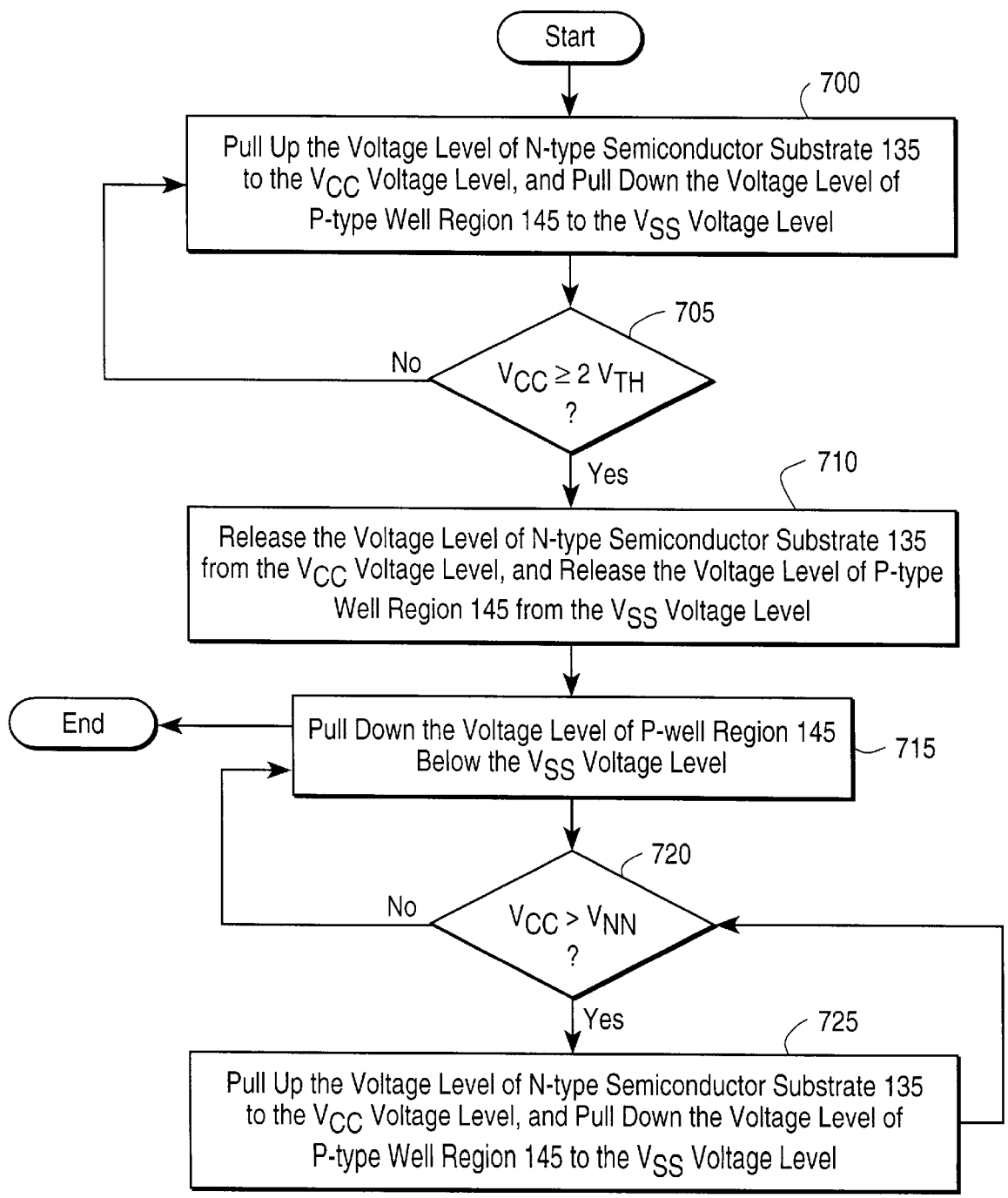
FIG. 11 is a flowchart illustrating steps in a method for operating the latch-up prevention circuit of FIG. 3.

FIG. 11 is a flowchart illustrating steps in a method for operating latch-up prevention circuit 200 in FIG. 3. In step 700, during initial power-up first clamping circuit 230 will pull up the $V_{NN}$ voltage level of n-type semiconductor substrate 135 to the $V_{CC}$ voltage level of $V_{CC}$ supply voltage source 210. Second clamping circuit 240 will pull down the $V_{BB}$ voltage level of p-type well region 145 to the $V_{SS}$ voltage level. If in step 705 the $V_{CC}$ voltage level has risen to or above $2V_{TH}$, then the invention proceeds to step 710. If not, then the invention proceeds back to step 700.

In step 710, first clamping circuit 230 will release the $V_{NN}$ voltage level of n-type semiconductor substrate 135 from the $V_{CC}$ voltage level of $V_{CC}$ supply voltage source 210. Second clamping circuit 240 will release the $V_{BB}$ voltage level of p-type well region 145 from the $V_{SS}$ voltage level. In step 715, $V_{BB}$ pump core 217 of charge pump 215 will generate negative charges to pull down the $V_{BB}$ voltage level of p-type well region 145 below the $V_{SS}$ voltage level. Since the $V_{BB}$ voltage level is driven to negative voltage levels, the leakage currents are reduced in four-transistor memory cell 600 disposed in p-type well region 145.

If in step 720 the $V_{CC}$ voltage level rises above the $V_{NN}$ voltage, then the invention proceeds to step 725. If not, then the invention proceeds back to step 715. In another preferred embodiment according to the invention, if in step 720 the $V_{CC}$ voltage level rises above $V_{NN}+\Delta V_{offset}$, then the invention proceeds to step 725. If not, the invention proceeds back to step 715.

In step 725, helper circuit 250 will pull up the $V_{NN}$ voltage level of n-type semiconductor substrate 135 up to the $V_{CC}$ voltage level of $V_{CC}$ supply voltage source 210, and will pull down the $V_{BB}$ voltage level of p-type well region 145 to the $V_{SS}$ voltage level. The invention will then proceed back to step 720.

Figure 12:
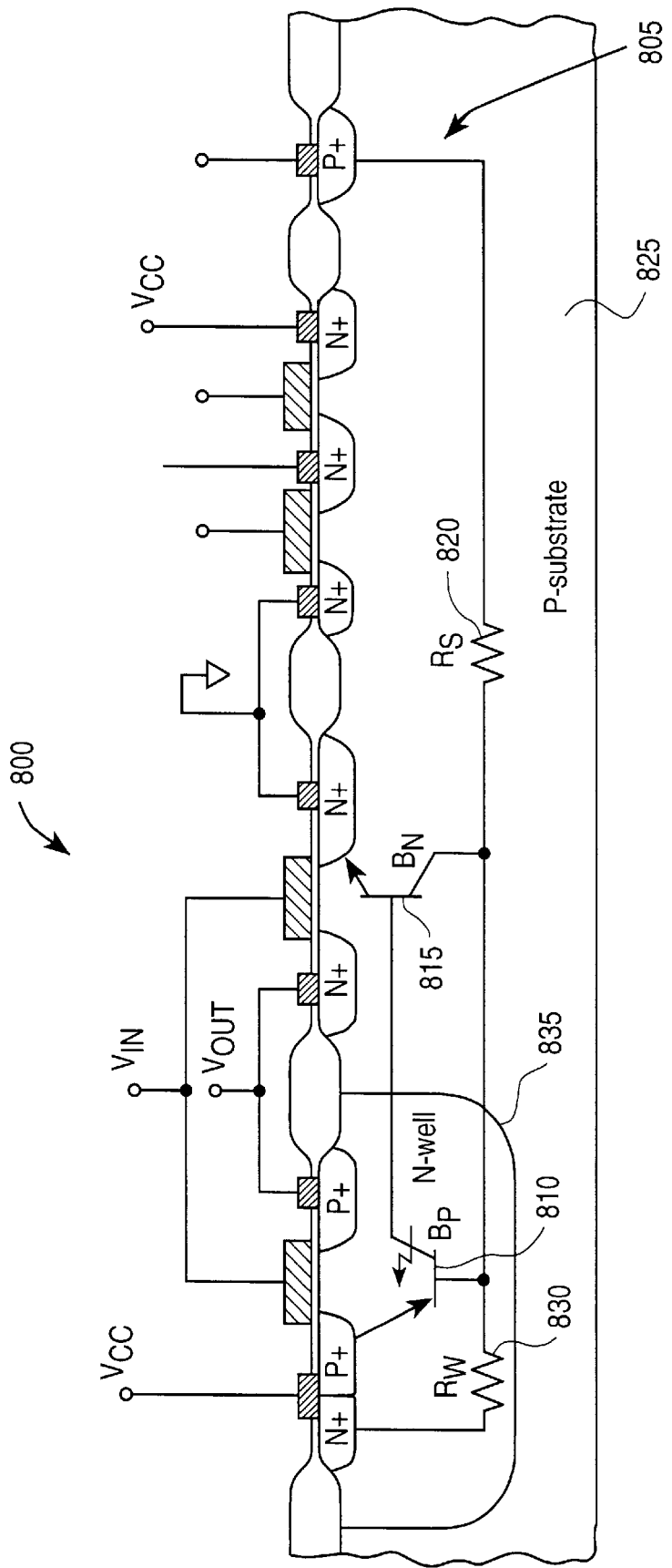
FIG. 12 shows an integrated circuit CMOS semiconductor device having a p-type substrate and an n-type well region.

Latch-up prevention circuit 200 can be used to prevent latch-up in a CMOS semiconductor device 800 as shown in FIG. 12. CMOS semiconductor device 800 includes a parasitic bipolar transistor circuit 805 inherent in a CMOS semiconductor device. Parasitic bipolar transistor circuit 805 includes the following: a parasitic pnp bipolar junction transistor 810, a parasitic npn bipolar junction transistor 815, resistor 820 representing the equivalent resistance of a p-type substrate 825, and a resistor 830 representing the equivalent resistance of an n-well region 835.

Figure 13:
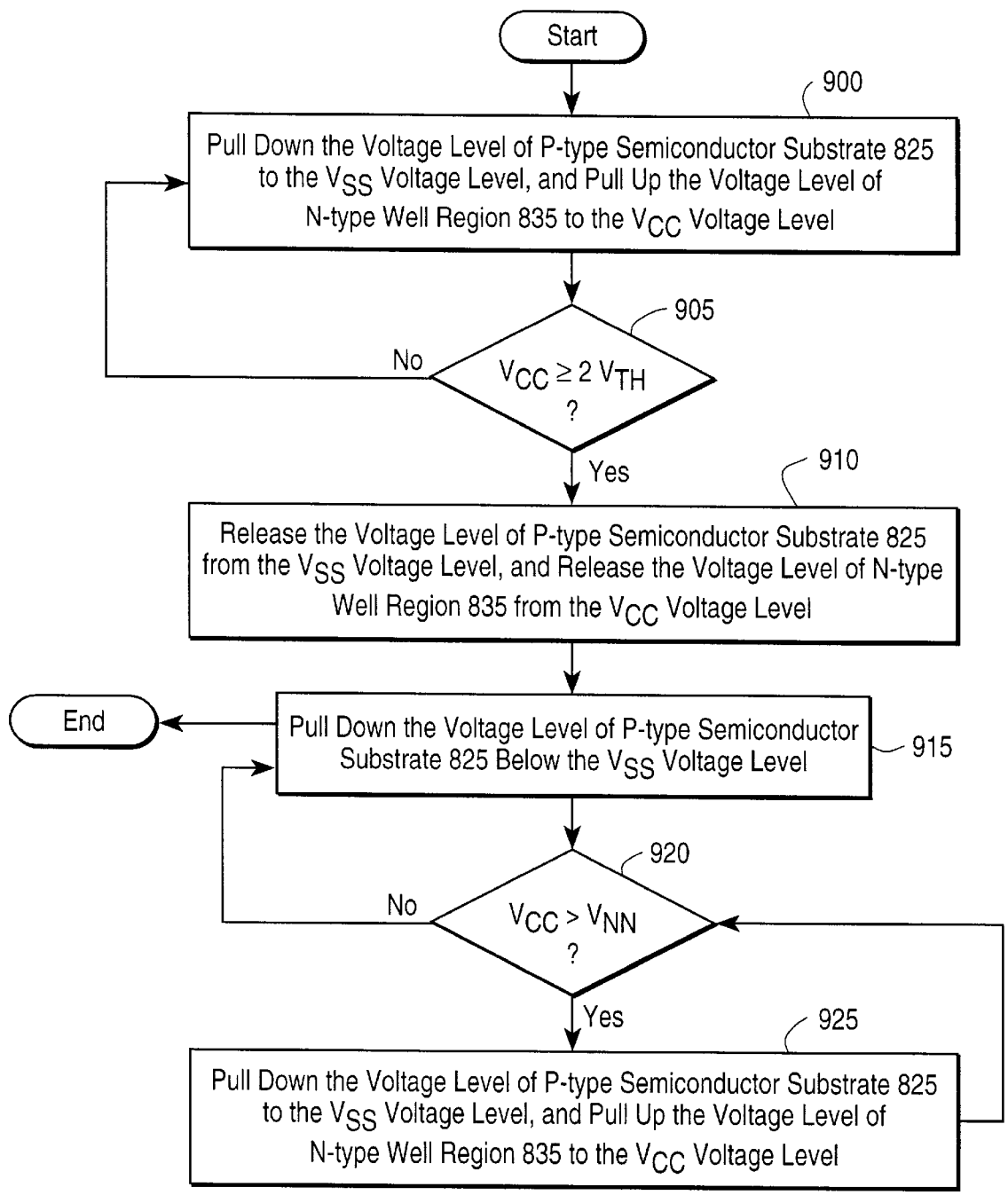
FIG. 13 is a flowchart illustrating steps in a method for operating the latch-up prevention circuit to prevent latch-up in the CMOS semiconductor device of FIG. 12.

FIG. 13 is a flowchart illustrating steps in a method for operating of latch-up prevention circuit 200 to prevent latch-up in the CMOS semiconductor device 800 of FIG. 12. In step 900 during initial power-up, first clamping circuit 230 will pull up the $V_{NN}$ voltage level of n-type well region 835 to the $V_{CC}$ voltage level of $V_{CC}$ supply voltage source 210. Second clamping circuit 240 will pull down the $V_{BB}$ voltage level of p-type semiconductor substrate 825 to the $V_{SS}$ voltage level. If in step 905 the $V_{CC}$ voltage level has risen to or above $2V_{TH}$, then the invention proceeds to step 910. If not, then the invention proceeds back to step 900.

In step 910, first clamping circuit 230 will release the $V_{NN}$ voltage level of n-type well region 835 from the $V_{CC}$ voltage level of $V_{CC}$ supply voltage source 210. Second clamping circuit 240 will release the $V_{BB}$ voltage level of p-type semiconductor substrate 825 from the $V_{SS}$ voltage level. As an option for particular applications, $V_{BB}$ pump core 217 of charge pump 215 will generate in step 915 negative charges to pull down the $V_{BB}$ voltage level of p-type semiconductor substrate 825 below the $V_{SS}$ voltage level.

If in step 920 the $V_{CC}$ voltage level rises above the $V_{NN}$ voltage level, then the invention proceeds to step 925. If not, then the invention proceeds back to step 915. In another preferred embodiment according to the invention, if in step 920 the $V_{CC}$ voltage level rises above $V_{NN}+\Delta V_{offset}$, then the invention proceeds to step 925. If not, then the invention proceeds back to step 915.

In step 925, helper circuit 250 will pull up the $V_{NN}$ voltage level of n-type well region 835 up to the $V_{CC}$ voltage level of $V_{CC}$ supply voltage source 210, and will pull down the $V_{BB}$ voltage level of p-type semiconductor substrate 825 to the $V_{SS}$ voltage level. The invention will then proceed back to step 920.

While various embodiments and applications of this invention have been shown and described, it will be apparent to those skilled in the art that modifications are possible without departing from the inventive concepts described herein. For example, first clamping circuit 230 may be designed to release $V_{NN}$ node 225 from $V_{CC}$ node 235 when the $V_{CC}$ level rises to a voltage level less than $2V_{TH}$ (e.g., one $V_{TH}$). Similarly, second clamping circuit 240 may be designed to release $V_{BB}$ node 220 from $V_{SS}$ node 245 when the $V_{CC}$ level rises to a voltage level of, for example, one $V_{TH}$. Helper circuit 250 may be designed to clamp $V_{BB}$ node 220 to $V_{SS}$ node 245 (and to clamp $V_{NN}$ node 225 to $V_{CC}$ node 235) when the $V_{CC}$ voltage level rises above the $V_{NN}$ voltage level and to a voltage value less than $2V_{TH}$ (e.g., one $V_{TH}$). The invention, therefore, is not to be restricted except in the spirit of the appended claims.

What is claimed is:

1. A method for preventing latch-up in a semiconductor device, comprising the steps of:

(a) detecting the voltage level $V_1$ of a first voltage terminal;

(b) pulling the voltage level $V_{sub}$ of a substrate to said $V_1$ when said $V_1$ is below a predetermined value, and releasing said $V_1$ from said substrate when said $V_1$ rises to said $V_{det}$;

(c) pulling the voltage level $V_{well}$ of a well region to the voltage level $V_2$ of a second voltage terminal when said $V_1$ is below said $V_{det}$, and releasing said $V_2$ from said well region when said $V_1$ rises to said $V_{det}$; and (d) when said $V_1$ rises to said $V_{det}$ and above said $V_{sub}$, pulling said $V_{sub}$ to said $V_1$ and pulling said $V_{well}$ to said $V_2$;

said substrate having a first conductivity type, and said well region having a second conductivity type and being in contact with said substrate.

2. The method of claim 1 further comprising the step of:

(e) when said $V_1$ rises to said $V_{det}$, driving said $V_{well}$ below said $V_2$ to reduce leakage currents in said well region.

3. The method of claim 2 wherein said leakage currents are generated by transistors of a memory cell in said well region.

4. The method of claim 1 wherein said first voltage terminal comprises a supply voltage source terminal, said second voltage terminal comprises a voltage ground terminal, said first conductivity type is an n-type, and said second conductivity type is a p-type.

5. The method of claim 4, when said $V_1$ rises to said $V_{det}$, further comprising the step of pulling said $V_{well}$ below said $V_2$ such that leakage currents are reduced in said well region.

6. The method of claim 5 wherein said leakage currents are generated by transistors of a memory cell in said well region.

7. A method for preventing latch-up in a semiconductor device, comprising the steps of:

(a) detecting the voltage level $V_1$ of a first voltage terminal;

(b) pulling the voltage level $V_{well}$ of a well region to said $V_1$ when said $V_1$ is below a predetermined value $V_{det}$, and releasing said $V_1$ from said well region when said $V_1$ rises to said $V_{det}$;

(c) pulling the voltage level $V_{sub}$ of a substrate to the voltage level $V_2$ of a second voltage terminal when said $V_1$ is below said $V_{det}$, and releasing said $V_2$ from said substrate when said $V_1$ rises to said $V_{det}$; and (d) when said $V_1$ rises to said $V_{det}$ and above said $V_{well}$, pulling said $V_{well}$ to said $V_1$ and pulling said $V_{sub}$ to said $V_2$;

said well region having a first conductivity type, and said substrate having a second conductivity type and being in contact with said well region.

8. A method for preventing latchup, comprising the steps of:
   (a) pulling a voltage level $V_{sub}$ of a substrate to a first voltage level $V_1$ when said $V_1$ is below a threshold voltage value $V_{thres}$, and releasing said $V_1$ from said substrate when said $V_1$ rises to said $V_{thres}$;
   (b) pulling the voltage level $V_{well}$ of a well region to a voltage level $V_2$ when said $V_1$ is below said $V_{thres}$, and releasing said $V_2$ from said well region when said $V_1$ rises to said $V_{thres}$; and
   (c) when said $V_1$ rises to said $V_{thres}$ and above said $V_{sub}$, pulling said $V_{sub}$ to said $V_1$ and pulling said $V_{well}$ to said $V_2$.

9. The method of claim 8 further comprising the step of providing a signal responsive to said $V_1$ for controlling said $V_{sub}$.

10. The method of claim 8 further comprising the step of pulling said $V_{well}$ below said $V_2$ when said $V_1$ rises to said $V_{thres}$.

11. A circuit for preventing latch-up in a semiconductor device, comprising:
   voltage detection means for detecting the voltage level $V_1$ of a first voltage terminal;
   first clamping means, coupled to the voltage detection means, for pulling the voltage level $V_{sub}$ of a substrate to said $V_1$ when said $V_1$ is below a predetermined value $V_{det}$ and for releasing said $V_1$ from said substrate when said $V_1$ rises to said $V_{det}$;
   second clamping means, coupled to the voltage detection means, for pulling the voltage level $V_{well}$ of a well region to the voltage level $V_2$ of a second voltage terminal when said $V_1$ is below said $V_{det}$ and for releasing said $V_2$ from said well region when said $V_1$ rises to said $V_{det}$; and
   helper means, coupled to said voltage detection means, for pulling said $V_{sub}$ to said $V_1$ and for pulling said $V_{well}$ to said $V_2$ when said $V_1$ rises to said $V_{det}$ and above said $V_{sub}$.

12. The circuit of claim 11 further comprising:
   charge pump means, coupled to said voltage detection means, for driving said $V_{well}$ below said $V_2$ when said $V_1$ rises to said $V_{det}$, said charge pump means reducing leakage currents in said well region.

13. The circuit of claim 12 wherein said leakage currents are generated by transistors of a memory cell in said well region.

14. A circuit for preventing latch-up in a semiconductor device, comprising:
   means for detecting the voltage level $V_1$ of a first voltage terminal;
   means for pulling the voltage level $V_{well}$ of a well region to said $V_1$ when said $V_1$ is below a predetermined value $V_{det}$, and for releasing said $V_1$ from said well region when said $V_1$ rises to said $V_{det}$;
   means for pulling the voltage level $V_{sub}$ of a substrate to the voltage level $V_2$ of a second voltage terminal when said $V_1$ is below said $V_{det}$, and for releasing said $V_2$ from said substrate when said $V_1$ rises to said $V_{det}$; and
   means for pulling said $V_{well}$ to said $V_1$ and for pulling said $V_{sub}$ to said $V_2$ when said $V_1$ rises to said $V_{det}$ and above said $V_{well}$;
   said well region having a first conductivity type, and said substrate having a second conductivity type and being in contact with said well region.

15. The method of claim 14 wherein said first voltage terminal comprises a supply voltage source terminal, said second voltage terminal comprises a voltage ground terminal, said first conductivity type is an n-type and said second conductivity type is a p-type.

16. The circuit of claim 15 further comprising charge pump means, coupled to said means for detecting the voltage level $V_1$, for pulling said $V_{well}$ below said $V_2$ to reduce leakage currents in said well region.

17. The circuit of claim 16 wherein said leakage currents are generated by transistors of a memory cell in said well region.

18. The circuit of claim 16 wherein said $V_{well}$ is pulled below said $V_2$ when said $V_1$ rises to said $V_{det}$.

19. A circuit for preventing latch-up, comprising:
   first means, responsive to a first voltage level $V_1$ of a first voltage terminal, for pulling the voltage level ($V_{sub}$) of a substrate to said $V_1$ when said $V_1$ is below a predetermined level $V_{det}$ and for releasing said $V_1$ from said substrate when said $V_1$ rises to said $V_{det}$;
   second means, responsive to said $V_1$, for pulling a voltage level $V_{well}$ of a well region to a second voltage level $V_2$ of a second voltage terminal when said $V_1$ is below said $V_{det}$ and for releasing said $V_2$ from said well region when said $V_1$ rises to said $V_{det}$; and
   third means, responsive to said $V_1$, for pulling said $V_{sub}$ to said $V_1$ and for pulling said $V_{well}$ to said $V_2$ when said $V_1$ rises to said $V_{det}$ and above said $V_{sub}$.

20. The circuit of claim 19 further comprising fourth means, coupled to said first means and to said second means, and responsive to said $V_1$, for transmitting to said first means and to said second means a signal responsive to said $V_1$.

21. The circuit of claim 20 further comprising fifth means, coupled to said fourth means, for pulling said $V_{well}$ below said $V_2$.

22. The circuit of claim 21 wherein said $V_{well}$ is pulled below said $V_2$ when said $V_1$ rises to said $V_{det}$.

23. The circuit of claim 19 wherein:
   said $V_{sub}$ indicates a voltage level of an n-type substrate; and
   said $V_{well}$ indicates a voltage level of a p-type well region.

24. A circuit for preventing latch-up in a semiconductor device, comprising:
   a first clamping circuit responsive to the voltage level $V_1$ of a first voltage terminal by pulling the voltage level $V_{sub}$ of a substrate to said $V_1$ when said $V_1$ is below a predetermined level $V_{det}$ and by releasing said $V_1$ from said substrate when said $V_1$ rises to said $V_{det}$;
   a second clamping circuit responsive to said $V_1$ by pulling the voltage level $V_{well}$ of a well region to the voltage level $V_2$ of a second voltage terminal when said $V_1$ is below said $V_{det}$ and by releasing said $V_2$ from said well region when said $V_1$ rises to said $V_{det}$; and
   a helper circuit responsive to said $V_1$ by pulling said $V_{sub}$ to said $V_1$ and by pulling said $V_{well}$ to said $V_2$ when said $V_1$ rises to said $V_{det}$ and above said $V_{sub}$;
   said substrate having a first conductivity type, and said well region having a second conductivity type and being in contact with said substrate.

25. The circuit of claim 24 further comprising a power-on detector coupled to said first clamping circuit and to said second clamping circuit, and responsive to said $V_1$ by transmitting a signal to said first clamping circuit and to said second clamping circuit.

26. The circuit of claim 25 further comprising a charge pump, coupled to said power-on detector, for pulling said $V_{well}$ below said $V_2$, such that leakage currents are reduced in said well region.

27. The circuit of claim 26 wherein said leakage currents are generated by transistors of a memory cell in said well region.

28. The circuit of claim 26 wherein said $V_{well}$ is pulled below said $V_2$ when said $V_1$ rises to said $V_{det}$.

29. The circuit of claim 24 wherein said first clamping circuit comprises:
- a first inverter having an input terminal and an output terminal;
- a first capacitive element connected between said first voltage terminal and said input terminal of said first inverter;
- a second capacitive element connected between said output terminal of said first inverter and said second voltage terminal; and
- a first switch connected between said substrate and said first voltage terminal and having an input terminal connected to said output terminal of said inverter, said first switch responsive to said $V_1$ by pulling said $V_{sub}$ to said $V_1$ when said $V_1$ is below said $V_{det}$ and by releasing said $V_1$ from said substrate when said $V_1$ rises to said $V_{det}$.

30. The circuit of claim 29 wherein said first switch comprises a p-channel transistor with its source connected to said substrate, its drain connected to said first voltage terminal, and its gate connected to said second capacitive element.

31. The circuit of claim 29 wherein said first inventer is further coupled between said substrate and said well region.

32. The circuit of claim 24 wherein said second clamping circuit comprises:
- a second inverter having an input terminal and an output terminal;
- a third capacitive element connected between said second voltage terminal and said input terminal of said second inverter;
- a fourth capacitive element connected between said first voltage terminal and said output terminal of said second inverter; and
- a second switch connected between said well region and said second voltage terminal, and responsive to said $V_1$ by pulling said $V_{well}$ to said $V_2$ when said $V_1$ is below said $V_{det}$ and by releasing said $V_2$ from said well region when said $V_1$ rises to said $V_{det}$.

33. The circuit of claim 32 wherein said second switch comprises
an n-channel transistor with its drain connected to said well region, its source connected to said second voltage terminal, and its gate connected to said fourth capacitive element.

34. The circuit of claim 32 wherein said second inverter is connected between said first voltage terminal and said well region.

35. The circuit of claim 24 wherein said helper circuit comprises:
- a comparator having a first input terminal coupled to said first voltage terminal, a second input terminal coupled to said substrate, and an output terminal, and responsive by producing a logic output signal when said $V_1$ rises to said $V_{det}$ and above said $V_{sub}$;
- a third switch connected between said well region and said second voltage terminal and having an input terminal coupled to said output terminal of said comparator;
- an inverting element having an input terminal coupled to said output terminal of said comparator and an output terminal; and
- a fourth switch connected between said substrate and said first voltage terminal and having an input terminal coupled to said output terminal of said comparator.

36. The circuit of claim 35 wherein said third switch comprises
an n-channel transistor with its drain connected to said well region, its source connected to said second voltage terminal, and its gate connected to the output terminal of said comparator.

37. The circuit of claim 35 wherein said fourth switch comprises a p-channel transistor with its source connected to said substrate, its drain connected to said first voltage terminal, and its gate connected to the output terminal of said inverting element.

38. The circuit of claim 25 further comprising
a clock generator coupled to said power-on detector, and configured to drive a transitioning clock signal to said power-on detector when said $V_1$ rises to said $V_{det}$.

39. A circuit for preventing latch-up in a semiconductor device, comprising:
- a first clamping circuit responsive to the voltage level $V_1$ of a first voltage terminal by pulling the voltage level of a well region to said $V_1$ when said $V_1$ is below a predetermined level $V_{det}$ and by releasing said $V_1$ from said well region when said $V_1$ rises to said $V_{det}$;
- a second clamping circuit responsive to said $V_1$ by pulling the voltage level $V_{sub}$ of a substrate to the voltage level $V_2$ of a second voltage terminal when said $V_1$ is below said $V_{det}$ and by releasing said $V_2$ from said substrate when said $V_1$ rises to said $V_{det}$; and
- a helper circuit responsive to said $V_1$ by pulling said $V_{well}$ to said $V_1$ and by pulling said $V_{sub}$ to said $V_2$ when said $V_1$ rises to said $V_{det}$ and above said $V_{well}$;
- said well region having a first conductivity type, and said substrate having a second conductivity type and being in contact with said well region.

40. The circuit of claim 39 further comprising a power-on detector coupled to said first clamping circuit and to said second clamping circuit, and responsive to said $V_1$ by changing state when said $V_1$ rises to said $V_{det}$.

41. The circuit of claim 40 further comprising
a clock generator coupled to said power-on detector, and configured to drive a transitioning clock signal to said power-on detector when said $V_1$ rises to said $V_{det}$.

42. A circuit for preventing latch-up, comprising:
- a voltage detection circuit for detecting the voltage level $V_1$ of a first voltage terminal;
- a charge pump coupled to said voltage detection circuit for charging a well region;
- a first clamping circuit coupled to said voltage detection circuit, and responsive to said $V_1$ by pulling the voltage level $V_{sub}$ of a substrate to said $V_1$ when said $V_1$ is below a predetermined level $V_{det}$ and by releasing said $V_1$ from said substrate when said $V_1$ rises to said $V_{det}$;
- a second clamping circuit coupled to said voltage detection circuit, and responsive to said $V_1$ by pulling the voltage level $V_{well}$ of said well region to the voltage level $V_2$ of a second voltage terminal when said $V_1$ is below said $V_{det}$ and by releasing said $V_2$ from said well region when said $V_1$ rises to said $V_{det}$; and
- a helper circuit responsive to said $V_1$ by pulling said $V_{sub}$ to said $V_1$ and by pulling said $V_{well}$ to said $V_2$ when said $V_1$ rises to said $V_{det}$ and above said $V_{sub}$;
- said substrate having a first conductivity type, and said well region having a second conductivity type and being in contact with said substrate.

43. The circuit of claim 42 further comprising
a clock generator coupled to said power-on detector, and configured to drive a transitioning clock signal to said voltage detection circuit when said $V_1$ rises to said $V_{det}$.

\* \* \* \* \*